United States Patent
Rich et al.

(10) Patent No.: US 10,302,689 B2
(45) Date of Patent: May 28, 2019

(54) PULSE GENERATOR DEVICE AND METHOD FOR EVALUATING A SENSOR BREAK

(71) Applicant: Eurotherm Ltd., London (GB)

(72) Inventors: Jonathan Rich, Worthing (GB); Mike Newsome, Eastborne (GB); Robert Donarski, Worthing (GB)

(73) Assignee: Eurotherm Limited, Shropshire (GB)

( * ) Notice: Subject to any disclaimer, the term of this patent is extended or adjusted under 35 U.S.C. 154(b) by 79 days.

(21) Appl. No.: 15/065,133

(22) Filed: Mar. 9, 2016

(65) Prior Publication Data

US 2016/0266188 A1 Sep. 15, 2016

(30) Foreign Application Priority Data

Mar. 9, 2015 (EP) .................................. 15158243

(51) Int. Cl.
  *G01R 31/02* (2006.01)
  *G01K 7/02* (2006.01)
  *G01R 31/28* (2006.01)

(52) U.S. Cl.
  CPC .......... *G01R 31/026* (2013.01); *G01K 7/026* (2013.01); *G01R 31/2829* (2013.01)

(58) Field of Classification Search
  CPC ................ G01R 21/133; G01R 21/001; G01R 21/1333; G01R 19/00; G01R 33/072; G01R 33/3806; G01R 33/3815; G01R 33/3873; G01R 33/3875; G01R 33/389; G01R 31/024; G01R 31/1227; G01R 31/026; G01R 15/26; G01R 19/2513; G01R 29/0814; G01R 29/0878; G01R 31/14; G01R 31/2829; G01D 21/00; H02H 3/006; H02H 7/0854; H04B 10/2504; H01L 22/14; H01L 21/67288; G01K 17/10; G01K 7/026; G01N 2021/8663; G01N 21/64; G01N 27/24; A61B 5/1495; A61B 5/6848; A61B 5/6849; A61B 5/145; A61B 5/14551; A61B 5/155; A61B 5/7235; A61B 5/4094; A61B 6/586; A61B 2562/02
  See application file for complete search history.

(56) References Cited

U.S. PATENT DOCUMENTS

| 3,973,184 | A  * | 8/1976 | Raber | G01K 7/026 |
| | | | | 324/537 |
| 4,496,250 | A  * | 1/1985 | Walsh | G01K 7/026 |
| | | | | 340/870.17 |
| 7,775,706 | B1 * | 8/2010 | Feller | G01K 17/10 |
| | | | | 374/29 |
| 9,978,627 | B2 * | 5/2018 | Biber | H01L 21/6833 |
| 2005/0038623 | A1* | 2/2005 | Hammerschmidt | |
| | | | | G01R 31/2829 |
| | | | | 702/118 |
| 2014/0239970 | A1* | 8/2014 | Mayes | G01K 7/026 |
| | | | | 324/537 |

(Continued)

*Primary Examiner* — Vinh P Nguyen
(74) *Attorney, Agent, or Firm* — Stinson Leonard Street LLP

(57) ABSTRACT

An electronic device having at least one connector for at least one wired sensor. The device has a sensor break detection unit, wherein the sensor break detection unit comprises a pulse generator outputting pulses of different polarity being adapted to output at least one electrical signal to the wired sensor and detector means for detecting a response signal from the wired sensor.

13 Claims, 4 Drawing Sheets

(56) References Cited

U.S. PATENT DOCUMENTS

2015/0185293 A1* 7/2015 Milano .............. G01R 31/2884
324/251

* cited by examiner

PULSE GENERATOR DEVICE AND METHOD FOR EVALUATING A SENSOR BREAK

BACKGROUND

The invention relates to an electronic device having at least one connector for at least one wired sensor, said device having further a sensor break detection unit. Furthermore, the invention relates to a method for detecting a break of at least one wired sensor. Devices and methods according to the invention may be used in the field of automation technology, e.g. for control of manufacturing machinery or data logging.

It is known from the art to detect a sensor break by means of under-voltage detection. The input impedance of the electronic device will act as a pull-down resistor bringing an open circuit to 0 V in the case of loss of connection. Sensor break is assumed if the reading collapses to a value of less than 10% of the full range.

These known devices have the disadvantage that low measurement values may be erroneous detected as a sensor break. Furthermore, detecting a sensor break takes several measurement cycles, depending on the input impedance and the capacities involved.

SUMMARY

Therefore, it is an object of the invention to provide a sensor break detection which is more reliable. Furthermore, it is an object of the invention to provide a sensor break detection having a shorter response time.

The object of the invention is solved by an electronic device according to claim 1 and a method for detecting a sensor break according to claim 10.

According to the invention, an electronic device is disclosed having at least one connector for at least one wired sensor. The electronic device may comprise or consist of a feedback control such as a temperature controller, a pressure controller or a flow controller. In other embodiments of the invention, the electronic device may comprise or consist of a data logger.

Accordingly, the at least one wired sensor may comprise generally an analog sensor. In some embodiments of the invention, the analog sensor may change its electric resistance in response to a varying measurement variable. In other embodiments of the invention, the analog sensor may generate a varying output voltage in response to a varying measurement variable. In some embodiments of the invention, the sensor may comprise any of a resistor-type thermometer, a thermo couple, a hot-wire mass air flow sensor or the like.

According to the invention, the electronic device comprises a sensor break detection unit. The sensor break detection unit is adapted to monitor the wired sensor and to generate a signal indicating the health status of the sensor. If the sensor or at least one wire of the sensor breaks, the signal generated by the sensor break detection unit changes its state, so that the sensor break can be signalized to supervisory staff and/or other electronic components of machinery comprising the electronic device. In other embodiments, measured values can be marked as invalid.

The sensor break detection unit comprises at least one pulse generator being adapted to output at least one electrical signal to the wired sensor. The electrical signal may comprise a current or a voltage pulse which is propagating over the wires of the sensor. The pulse generator may be adapted to output electrical signals repeatedly so that the health status may be monitored continuously. The voltage, the current or the electrical power may be selected such that the sensor signal is not affected by the electric pulses used for sensor break detection.

Furthermore the sensor break detection unit comprises detector means for detecting a response signal from the wired sensor. The response signal may be altered by the wired sensor so that at least one parameter of the at least one electrical signal generated by the pulse generator is indicative of the health status of the sensor. The at least one parameter may be selected from any of a travelling time, a pulse shape or an amplitude.

In some embodiments of the invention, the pulse generator may be adapted to output subsequently at least to pulses having different polarity, thereby resulting in a response signal having a different polarity as well. This feature has the technical effect that a sensor break may be detected more reliably and false positive results can be avoided.

In some embodiments of the invention, the pulse generator may be adapted to output two subsequent pulses within a time span being selected from approximately 40% to approximately 60% of a full cycle of the mains supply frequency of the electronic device. As detecting the response signal is matched to the output of the pulse generator, the time needed for measuring two subsequent pulses is matched to a full cycle of the mains supply frequency, Noise from the mains supply, which is integrated by the detector means, may be minimized by integrating a full cycle of the mains supply as signal parts having positive and negative amplitude extinguish each other. Therefore, the signal/noise ratio may be increased.

In some embodiments of the invention, the pulse generator may be adapted to output two subsequent pulses within a time span being selected from approximately 45% to approximately 55% of a full cycle of the mains supply frequency. In still other embodiments, the pulse generator may be adapted to output two subsequent pulses within a time span being selected from approximately 48% to approximately 52% of a full cycle of the mains supply. In still other embodiments, the pulse generator may be adapted to output two subsequent pulses within a time span of 8.0 ms and 9.4 ms. These values may be suitable to ensure an increased signal to noise ratio for a mains supply of 50 Hz as well as 60 Hz.

In some embodiments of the invention, said detector means may comprise at least one analog/digital converter. This allows a signal analysis by means of digital electronics, The electronic device may be easily integrated into a digital electronic network.

In some embodiments of the invention, the detector means may be adapted to execute at least one measurement cycle comprising of at least one measurement of a main input value, at least one measurement of the response signal and optionally at least one measurement of a cold junction temperature. The measurement cycle may in some embodiments be completed within a time span between approximately 80 ms and approximately 160 ms. In other embodiments, a measurement cycle may be completed within a time span of approximately 100 ms and approximately 120 ms. In some embodiments of the invention, the measurement cycle may be carried out repeatedly. During measurement of the main input value, the action of the pulse generator may be stop in order to avoid any influence of the pulse generator to the sensor signal. Thus, the sensor signal can be acquired with high precision.

Subsequently after measurement of a main input value, the health status of the sensor is checked by outputting at least one pulse or two subsequent pulses having different polarity to the wired sensor. A response signal is acquired and optionally converted by means of an ADC.

The health status of the sensor may be determined from these measured values by means of an evaluations circuit. In some embodiments of the invention, the evaluation circuit may comprise a microprocessor or a microcontroller and at least one piece of software that, when being executed on the microprocessor, is carrying out the calculations necessary to determine the sensor health status. If the wired sensor includes a thermocouple, a cold junction temperature may be measured at the beginning or at the end of each measurement cycle. Measurement of a cold junction temperature may be done by means of a resistance thermometer like a platinum thermometer known as PT100.

In some embodiments of the invention, an evaluation circuit may be present being adapted to calculate a sensor break value $SB_{val}$ from a single response signal SB and the main input value MIV. In other embodiments of the invention, an evaluation circuit may be present being adapted to calculate a sensor break value $SB_{val}$ from a plurality of response signals $SB_+$ and $SB_-$ and the main input value MIV. As the sensor is delivering the main input value at any time, this main input value is also a part of the response signal measured at the connector of the wired sensor. Therefore, the sensor break value $SB_{val}$ may be calculated from the difference of the at least one response signal and the main input value $$SB_{val} = SB - MIV \text{ or}$$

$$SB_{val} = SB_+ + SB_- - 2 \cdot MIV.$$

In some embodiments of the invention, noise on the sensor break signal may be rejected by means of a filter function. In some embodiments of the invention, the filter function may comprise a calculation of a first order moving average $SB_{filt1}$ of the sensor break value $SB_{val}$ using a time constant $SB_{TC}$ according to the following formula:

$$SB_{filt1} = SB_{filt1} + \frac{SB_{val} - SB_{filt1}}{SB_{TC}}.$$

In some embodiments of the invention, noise may be rejected by applying a two stage filter function to the measured raw value of the sensor break value $SB_{val}$. In some embodiment of the invention, filtering may comprise calculating a second order moving average $SB_{filt2}$ of the sensor break value $SB_{val}$ using the time constant $SB_{TC}$ according to the following formula:

$$SB_{filt2} = SB_{filt2} + \frac{SB_{filt1} - SB_{filt2}}{SB_{TC}}.$$

The value of the time constant $SB_{TC}$ is chosen to afford maximum noise rejection whilst still maintaining a suitable response time. In some embodiments of the invention, the time constant $SB_{TC}$ is chosen such that the response time may be smaller than 0.5 s. In other embodiments of the invention, the time constant $SB_{TC}$ is chosen such that the response time may be smaller than 0.25 s.

In some embodiments of the invention, the evaluation circuit is adapted to calculate the modulus of the sensor break value $SB_{val}$ and any of the first order or the second order moving averages $SB_{filt1}$ or $SB_{filt2}$, wherein the evaluation circuit is adapted further to compare the result with a predefined first threshold value $TH_1$. If the resulting value is found to be greater than the threshold value, a false sensor break detection is rejected. This embodiment of the invention makes the sensor break detection less susceptible to input signal transients during the measurement cycle.

In some embodiments of the invention, the evaluation circuit may be adapted to reject a sensor break signal if the modulus of two ore more consecutive measurements of the main input value MIV is greater than a predefined second threshold value $TH_2$. This algorithm is based on the fact that the main input value is pulled down to 0 V by the input impedance of the electronic device if the sensor is not continuously delivering data. Therefore, the input signal is constant after a sensor break. The modulus of two or more consecutive measurements is therefore 0 or at least smaller than a predefined second threshold value $TH_2$. Therefore, a sensor break signal may be rejected if the modulus of two ore more consecutive measurements is greater than said predefined threshold value $TH_2$. Therefore, the acquired sensor break signal may be validated by watching the main input values.

BRIEF DESCRIPTION OF THE DRAWINGS

The present invention may be more easily understood and better appreciated when taken in conjunction with the accompanying drawing, in which.

DETAILED DESCRIPTION

Figure 1:
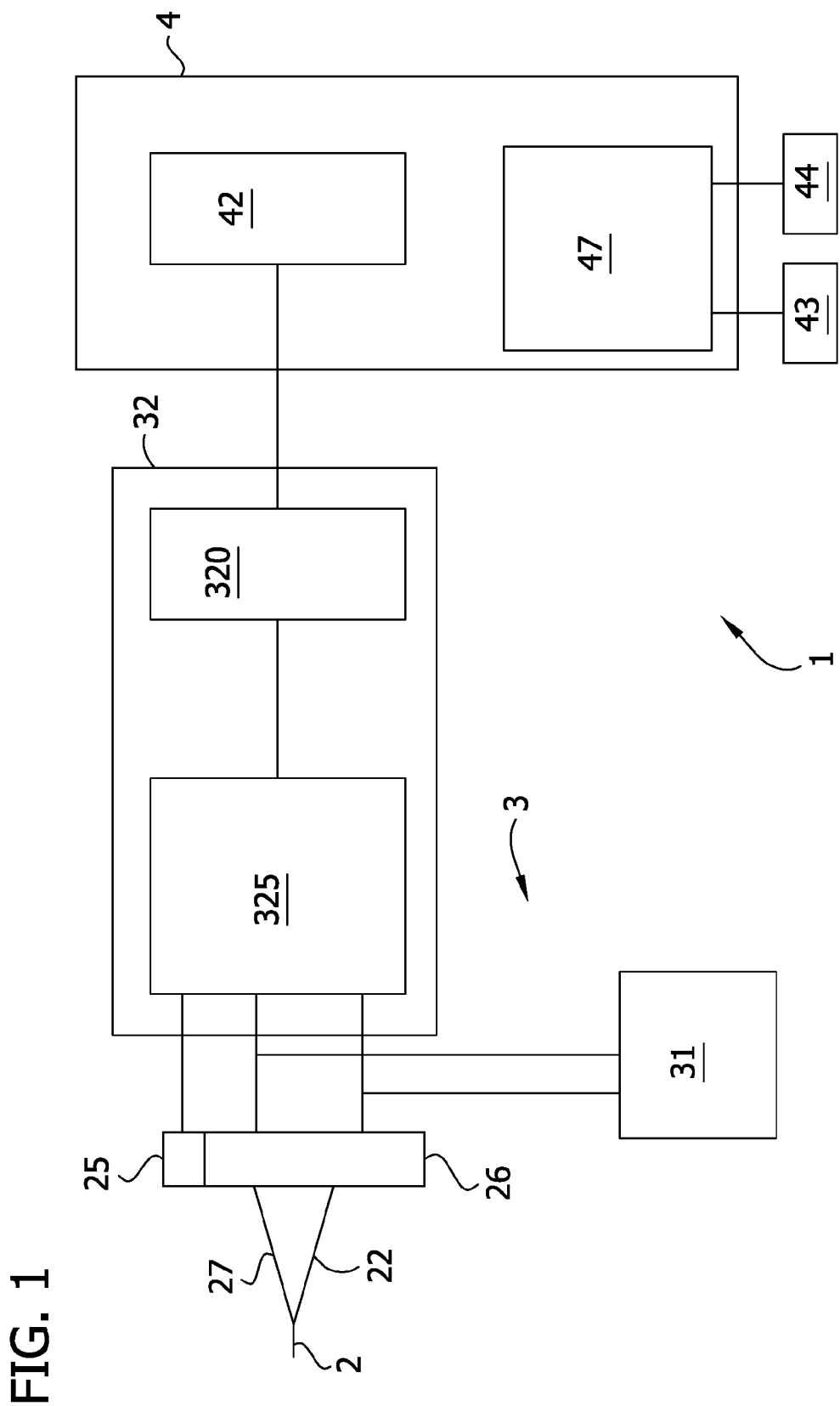
FIG. 1 illustrates one embodiment of an electronic device according to the invention.

The following description is merely exemplary and is in no way intended to limit the disclosure, its application, or uses. For purposes of clarity, the same reference numbers will be used in the drawings to identify similar elements. As used herein, the phrase at least one of A, B and C should be construed to mean a logical (A or B or C), using a non-exclusive logical or. It should be understood that steps within a method may be executed in different order without altering the principle of the present disclosure.

Looking now at FIG. 1, an exemplary embodiment of an electronic device 1 is shown. The electronic device 1 may consist of or comprise a data logger, a control circuit or a feedback control circuit. In some embodiments, the electronic device 1 is a temperature controller.

The electronic device 1 has at least one connector 26 for at least one wired sensor 2. The wired sensor 2 may generate a voltage in response to changing ambient conditions. In other embodiments of the invention, the sensor 2 may change its electrical resistance in response to changing ambient conditions. In some embodiments of the invention, the sensor 2 may comprise any of a thermo couple, a resistance thermometer, a hot-wire mass flow meter or a hot-wire anemometer. It should be clear to one of ordinary skill in the art that the sensors mentioned are not limiting the invention. Those skilled in the art will apply the principles disclosed easily to any other known sensor.

The sensor 2 has two wires 21 and 22 which are intended to supply electrical signals from the sensor 2 via the connector 26 to the electronic device 1. In other embodiments of the invention, the sensor 2 may have a greater number of wires. In some embodiments of the invention, the number of wires may amount 2, 3 or 4.

If the wired sensor 2 comprises a thereto couple, the connector 26 constitutes the cold junction of the voltage generating circuit. In order to enhance accuracy of the temperature measurement, the temperature of the cold junction can be measured by at least one cold junction temperature sensor 25. In some embodiments, the cold junction temperature sensor 25 may comprise a platinum thermometer or any other type of resistance thermometer.

The signal generated by the sensor 2 connects to an input of detector means 32. Detector means 32 are provided to gather at least one main input value of the sensor 2, e.g. a wind speed, a flow or a temperature. Furthermore, detector means 32 are adapted to detect a response signal for calculating a sensor break value.

In the embodiment shown, detector means 32 comprise at least one analog/digital converter 320. The analog/digital converter 320 may have a resolution from 16 bits to 24 bits in order to ensure high quality measurements with low errors. The ADC 320 is adapted to generate a digital data stream representing the data of the sensor 2.

Furthermore, detector means 32 may comprise an optional multiplexer 325. The multiplexer 325 may allow data acquisition from a plurality of sensors 2 with a single ADC 320. In other embodiments of the invention, every sensor 2 out of plurality of sensors may have a dedicated ADC 320, so that data acquisition may be performed at higher data rate. In theses cases, a multiplexer 325 may be omitted.

The digital data stream digital data stream from the ADC 320 is supplied to an evaluation circuit 4. The evaluation circuit 4 may comprise a memory 42. The memory 42 may comprise any of a DRAM or a flash memory or a hard drive to store acquired data.

Furthermore, the evaluation circuit 4 may comprise a microprocessor 41. The microprocessor 41 may be adapted to calculate at least one sensor break value being indicative of the health status of the sensor 2. In some embodiments, the microprocessor 41 may calculate a plurality of sensor break values. In some embodiments, the microprocessor 41 may be adapted to validate a plurality of sensor break values in order to increase accuracy and to avoid false sensor break signals.

Furthermore, an optional display 44 may be present to visualize acquired data. In some embodiments, an optional interface 43 may be present to supply sensor data and/or to signal a sensor break to machinery comprising the electronic device 1.

To perform sensor break detection, a pulse generator 31 is present. The pulse detector 31 and detector means 32 are part of a sensor break detection unit 3. The pulse detector outputs at least one electrical signal to the wired sensor 2. The electrical signal may comprise at least one current pulse or at least one voltage pulse, The raw signal outputted by the pulse generator is altered by the impedance of the connector 26 and the sensor 2. This altered signal is detected by the ADC 320, After a sensor break, the impedance of the sensor 2 changes, which causes a change of the response signal detected by the ADC 320. These changes of the response signal are assessed by the evaluation circuit 4 and a sensor break may be signaled.

Figure 2:
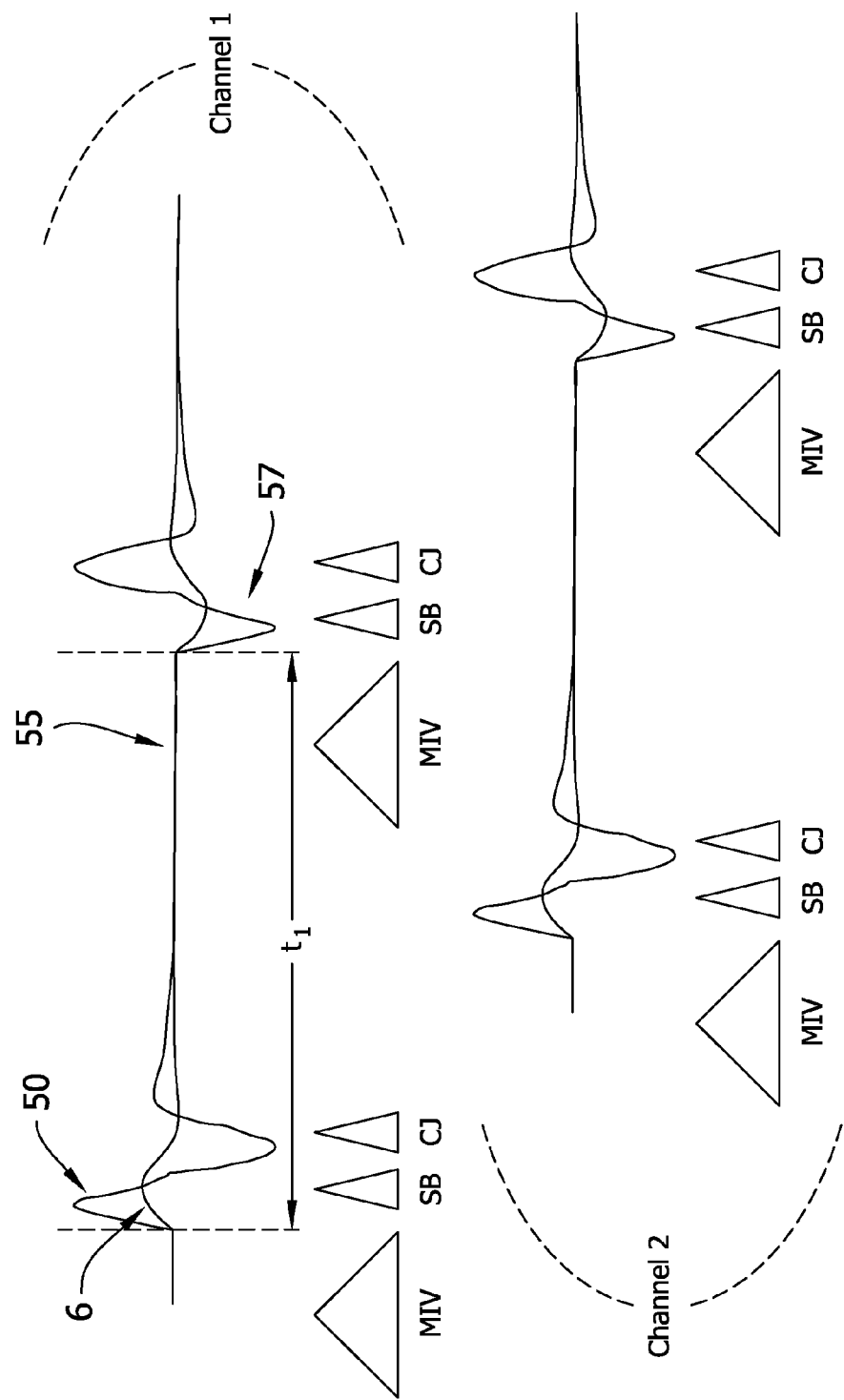
FIG. 2 illustrates one embodiment of the timing of pulses used for sensor break detection according to the invention.
Figure 3:
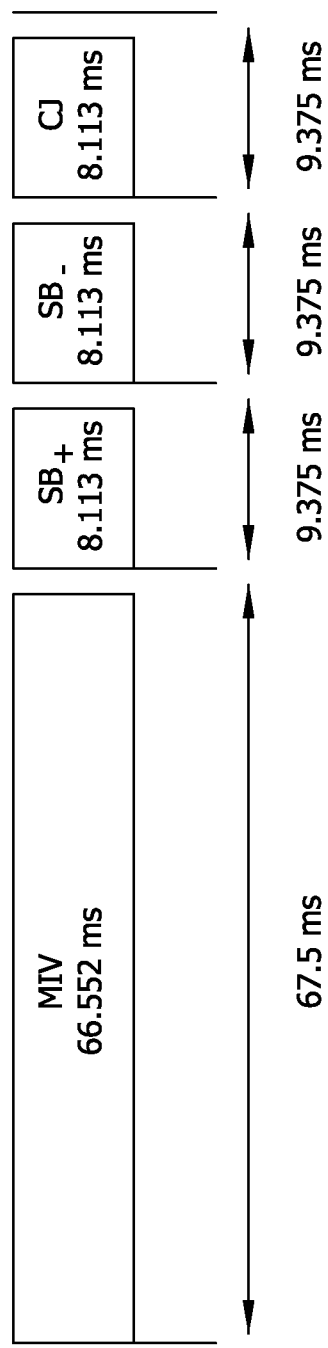
FIG. 3 illustrates one embodiment of the timing of data acquisition.

With respect to FIG. 2 and FIG. 3, exemplary embodiments for electrical signals and timing diagrams are shown.

The upper part of FIG. 2 illustrates a timing diagram for a first sensor being attached to a first input channel of the electronic device 1. The lower part of FIG. 2 illustrates a timing diagram for a second sensor being connected to a second channel of the electronic device 1. Both channels can be connected to a single ADC by means of a multiplexer 325. In other embodiments two ADCs 320 may be present, so that each channel has a dedicated ADC 320 for signal conversion.

Looking at channel 1, an exemplary measurement cycle starts with a measurement of a main input value MIV. The main input value denotes a measurement of the data of interest, e.g. a temperature, if the sensor 2 is a temperature sensor. In some embodiments of the invention, the measurement of the main input value may take between 40 ms and 80 ms. In the exemplary embodiment shown in FIG. 3, measurement of the main input value takes 66.552 ms.

After the main input value measurement has been finished, the pulse generator 31 generates a voltage pulse on the sensor connector. Reference 50 of FIG. 2 shows the voltage pulse as seen on the wires 21 and 21 during an open circuit condition. In some embodiments of the invention, the peak voltage may be smaller than 120 mV, so that interference with other devices or disturbance of a digital data bus can be avoided. Furthermore, the power dissipation inside the sensor 2 is negligible small, so that disturbance of the measurement of the main input variable can be avoided.

Line 6 of FIG. 2 illustrates the response signal as seen by the ADC 320 during an open circuit condition of the sensor 2. Due to the sample-and-hold stage of the ADC acting as a low pass filter, only one half of the wave form generated by the pulse generator 31 is seen by the ADC. The response signal 6 is converted into a digital value by the ADC 320 and supplied to the memory 42 of the evaluation circuit 4.

After pulse generation and measurement of the response signal, an optional measurement of a cold junction temperature CLT or a measurement of a common mode voltage can be performed.

After having reached a settled region 55 within a time span $t_1$, the A/D conversion sequence starts again with the measurement of a main input variable MTV. In some embodiments of the invention, the pulse generator may be adapted to output pulses having different polarity, so that the second measurement is performed with a second pulse 51 having different polarity then the first pulse 50.

The repetition rate of the A/D conversion sequence is indicated as time span $t_1$ in FIG. 2. In some embodiments of the invention, $t_1$ may be selected from approximately 110 ms to approximately 300 ms. In other embodiments, $T_1$ may be selected from approximately 200 ms to approximately 250 ms. In still another embodiment, $t_1$ may amount approximately 220 ms.

If a multiplexer is used, values from channel 2 may be acquired with a phase shift, so that data from channel 2 is acquired during the relaxation time of channel 1 and vice versa.

FIG. 3 shows an alternative timing diagram for an A/D conversion sequence. This timing diagram comprises measurement of a main input value MIV and subsequent measurement of two sensor break signals. The sensor break signal for a positive pulse $SB_+$ and the sensor break signal from a negative pulse $SB_-$ are acquired within a time span of 18.75 ms. This time is selected to match approximately a full cycle of a mains supply frequency, so that noise from the mains supply may be suppressed by adding both values. The selected time span is higher than the optimum value needed for a 50 Hz mains supply but lower than the optimum value needed for a 60 Hz mains supply, so that the device is equally suited for 50 or 60 Hz mains. Those skilled in the art will easily adjust this timing if a supply voltage having different frequency is used, e.g. on a railroad loco or on board of a plane.

Figure 4:
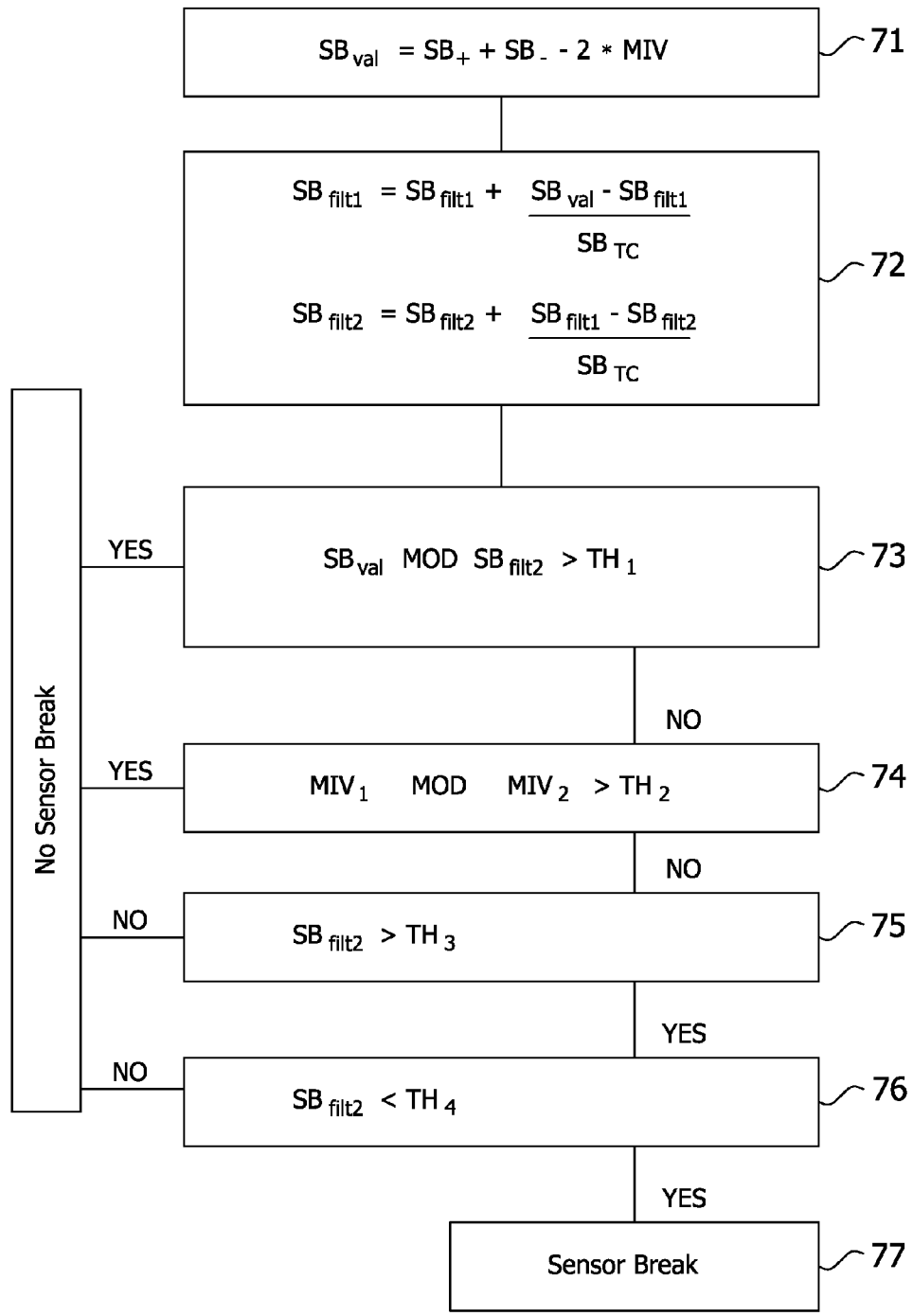
FIG. 4 illustrates a flow chart of one embodiment of a method according to the invention.

FIG. 4 illustrates the generation of a sensor break signal from the measured response: signal by the evaluation circuit 4.

As can be easily appreciated from FIGS. 2 and 3, measurement of a sensor break value SB is disturbed by the main input value MIV, as the sensor continuously delivers data. On the other hand, measurement of the main input value MIV is not disturbed by the sensor break signal, as MIV measurement is carried out when the pulse generators 31 is switched off. Therefore, a sensor break value $SB_{val}$ is corrected in a first method step 71 by subtracting the main input value. If a plurality of response signals $SB_+$ and $SB_-$ is taken, a corresponding number of main input values will be subtracted.

In a subsequent second method step 72, the raw value calculated in the first method step 71 is filtered for noise rejection. The time constant $SB_{TC}$ applied is chosen to afford maximum noise rejection whilst still maintaining a reasonable response time, e.g. less than 0.25 s. Optionally, a two-stage filtering may be applied to improve noise rejection.

As the raw sensor break value $SB_{val}$ is derived from three separate measurements, the algorithm may be susceptible to input signal transients during the measurement cycle. Therefore, the third method step 73 is carried out to reject such potential disturbances. The third method step 73 comprises a calculation of the modulus of the difference between the raw sensor break value $SB_{val}$ and the current filtered value $SB_{filt2}$. The resulting value is compared against a first threshold value $TH_1$ and if it is found to be greater, a false sensor break detection is rejected.

As protection against low frequency input clewing causing false sensor break detections, a fourth method step can be performed. This fourth method step 74 comprises calculating the modulus of the difference between two consecutive main input measurements. The resulting value is compared against a second threshold $TH_2$. If it is found to be greater, a false sensor break detection is rejected.

In the fifth method steps 75, the filtered value $SB_{filt2}$ of the sensor break signal is compared against a third threshold $TH_3$ being indicative for a sensor break.

In the sixth method step 76, the filtered value $SB_{filt2}$ of the sensor break signal is compared against a fourth threshold $TH_4$. This fourth threshold indicates an open circuit.

Finally, a sensor break signal of high accuracy can be generated in the last method step 77. The method shown in FIG. 4 has the advantage of reasonable response times and low error rates, i.e. false-positive or false-negative sensor break signals are avoided.

Obviously, readily discernable modifications and variations of the present invention are possible in the light of the above teachings. It is therefore to be understood that within the scope of the appended claims, the invention may be practice otherwise then as specifically described herein. For example, while describing the invention in terms of discrete components interactively cooperating, it is contemplated that the system described herein may be practiced entirely in software or by means of an application specific integrated circuit (ASIC). Software may be embodied in a carrier such as a magnetic or an optical disc, or a radio frequency carrier wave.

Those skilled in the art can now appreciate from the foregoing description that a broad teaching of the disclosure can be implemented in a variety of forms. Therefore, while this disclosure includes particular examples, the true scope of the disclosure should not be limited since other modifications will become apparent to the skilled practitioner upon a study of the drawings, the specification and the following claims.

What is claimed is:

1. An electronic device, adapted to be supplied with voltage from a mains supply having a frequency, the device having at least one connector for at least one wired sensor, the device comprising a sensor break detection unit, the sensor break detection unit having a pulse generator being adapted to output at least one electrical signal to the wired sensor and detector means for detecting a response signal ($SB_+$, $SB_-$) from the wired sensor wherein said at least one electrical signal output by the pulse generator includes at least two pulses having different polarity.

2. The device according to claim 1, wherein said at least one electrical signal output by the pulse generator includes two pulses within a time span being selected from approximately 40% to approximately 60% of a full cycle of the frequency of the mains supply from which the electronic device is supplied with voltage.

3. The device according to claim 1, wherein said detector means comprise at least one Analog/Digital-Converter and wherein said detector means are adapted to execute at least one measurement cycle selected from one or more of the following:
   at least one measurement of a predefined main input value (MIV) denoting a measurement of a data of interest sensed by the wired sensor before the pulse generator outputs the at least one electrical signal including the at least two pulses during the measurement cycle,
   at least one measurement of the response signal ($SB_+$, $SB_-$), and
   if the wired sensor comprises a thermocouple, at least one measurement of a cold junction temperature (CJ) of the connector measured by a cold junction temperature sensor after the pulse generator outputs the at least one electrical signal including the at least two pulses during the measurement cycle.

4. The device according to claim 3, having an evaluation circuit being adapted to calculate a sensor break value ($SB_{val}$) from the difference of the at least one response signal ($SB_+$, $SB_-$) and the main input value (MIV) according to the following formulae:

$$SB_{val}=SB-MIV \text{ or}$$

$$SB_{val}=SB_+ + SB_- - 2 \cdot MIV,$$

5. The device according to claim 4, wherein the evaluation circuit is adapted to calculate a first order moving average ($SB_{filt1}$) of the sensor break value ($SB_{val}$) using a predefined time constant ($SB_{TC}$) according to the following formula:

$$SB_{filt1} = SB_{filt1} + \frac{SB_{val} - SB_{filt1}}{SB_{TC}}.$$

6. The device according to claim 5, wherein the evaluation circuit is adapted to calculate a second order moving average ($SB_{filt2}$)) of the sensor break value ($SB_{val}$) using the time constant ($SB_{TC}$) according to the following formula:

$$SB_{filt2} = SB_{filt2} + \frac{SB_{filt1} - SB_{filt2}}{SB_{TC}}.$$

7. The device according to claim 6, wherein the evaluation circuit is adapted to calculate a modulus difference between the raw sensor break value ($SB_{val}$) and any of the first order or the second order moving averages ($SB_{filt1}$, $SB_{filt2}$) and wherein the evaluation circuit (4) is adapted further to compare the result with a predefined first threshold value ($TH_1$).

8. The device according to claim 1, wherein the evaluation circuit is adapted to reject a sensor break signal if a resulting value of a modulus calculation of two or more consecutive measurements of the main input value (MIV) is greater than a predefined second threshold value.

9. A method for detecting a break of at least one wired sensor, the method comprising:
sensing a mains supply voltage having a frequency,
supplying at least one electrical signal to the wired sensor by means of a pulse generator, wherein the at least one electrical signal includes at least two pulses having different polarity, and
receiving a response signal (SB+, SB−) from the wired sensor within a time span selected as a function of the mains supply voltage frequency, wherein a predefined difference between the response signal and a predefined main input value (MIV) is indicative of a break of the at least one wired sensor, wherein the main input value (MIV) denotes a measurement of a data of interest sensed by the wired sensor.

10. The method according to claim 9, wherein the at least two pulses are supplied within the time span being selected from approximately 40% to approximately 60% of a full cycle of the frequency of the mains supply.

11. The method according to claim 9, further comprising executing at least one measurement cycle comprising at least one measurement of the predefined main input value (MIV) denoting a measurement of a data of interest before said supplying the at least one electrical signal, at least one measurement of the response signal ($SB_+$, $SB_-$), and optionally at least one measurement of a cold junction temperature (CJ) after said supplying the at least one electrical signal.

12. The method according to claim 9, further comprising calculating a sensor break value ($SB_{val}$) from the difference of the at least one response signal ($SB_+$, $SB_-$) and the main input value (MIV) according to the following formulae:

$SB_{val}$=SB−MIV or $SB_{val}$=$SB_+$+$SB_-$−2·MIV.

13. The method according to claim 9, further comprising calculating by means of an evaluation circuit a first order moving average ($SB_{filt1}$) of the sensor break value ($SB_{val}$) using a time constant ($SB_{TC}$) according to the following formula:

$$SB_{filt1} = SB_{filt1} + \frac{SB_{val} - SB_{filt1}}{SB_{TC}},$$

and
calculating by means of the evaluation circuit an optional second order moving average ($SB_{filt2}$) of the sensor break value ($SB_{val}$) using the time constant ($SB_{TC}$) according to the following formula:

$$SB_{filt2} = SB_{filt2} + \frac{SB_{filt1} - SB_{filt2}}{SB_{TC}}.$$

* * * * *